(12) United States Patent
Sugimoto et al.

(10) Patent No.: US 6,696,699 B2
(45) Date of Patent: Feb. 24, 2004

(54) LUMINESCENT DISPLAY DEVICE AND METHOD OF MANUFACTURING SAME

(75) Inventors: Akira Sugimoto, Tsurugashima (JP); Kenichi Nagayama, Tsurugashima (JP)

(73) Assignee: Pioneer Corporation, Tokyo-To (JP)

( * ) Notice: Subject to any disclaimer, the term of this patent is extended or adjusted under 35 U.S.C. 154(b) by 0 days.

(21) Appl. No.: 10/138,641

(22) Filed: May 6, 2002

(65) Prior Publication Data
US 2002/0167269 A1 Nov. 14, 2002

(30) Foreign Application Priority Data
May 11, 2001 (JP) .................................. P2001-141198

(51) Int. Cl.[7] .......................... H01L 51/20; H01L 33/00
(52) U.S. Cl. ........................ 257/40; 257/99; 257/103
(58) Field of Search ............................ 257/40, 99, 103

(56) References Cited

U.S. PATENT DOCUMENTS 6,416,888 B1 * 7/2002 Kawamura et al. ......... 428/690
6,451,458 B1 * 9/2002 Sakakibara et al. ......... 428/690

\* cited by examiner

*Primary Examiner*—Jerome Jackson
(74) *Attorney, Agent, or Firm*—Sughrue Mion, PLLC

(57) ABSTRACT

A luminescent display device comprises a resin substrate having one and another surfaces, an auxiliary electrode made of metal and disposed on the one surface of the resin substrate, a transparent electrode disposed on the auxiliary electrode in a conductive state to the auxiliary electrode, and a luminescent layer composed of an organic compound and disposed on the transparent electrode. A layer of metal oxide may be further formed between the resin substrate and the auxiliary electrode.

9 Claims, 3 Drawing Sheets

LUMINESCENT DISPLAY DEVICE AND METHOD OF MANUFACTURING SAME

BACKGROUND OF THE INVENTION

The present invention relates to a luminescent display device including a substrate, particularly formed of resin substrate, and a transparent electrode, an auxiliary electrode and a luminescent layer which are laminated on the substrate and also relates to a method of manufacturing such luminescent display device.

Generally, there is known an organic EL (electroluminescent or electroluminescent) display element, and such organic EL display element has been manufactured on a transparent glass substrate as a luminescent display device.

FIG. 5 represents steps for preparing an organic EL element on a glass substrate. That is, a glass substrate 1 is prepared (step S1). A transparent electrode 2 as anode is formed on the substrate 1 in form of a film (step S2), and in this step S2, the transparent electrode 2 is formed at a high temperature of more than 200° C. for the purpose of reducing resistance. This transparent electrode 2 is subjected to a patterning treatment or process by using a photoresist or acid so as to provide a stripe shape.

Next, a metal film 3 constituting an auxiliary electrode is formed on the transparent electrode 2 (step S4). This metal film 3 as auxiliary electrode is then subjected to the patterning treatment, as in the former step S3, by using a photoresist or acid (step S5). In this step S5, although the acid is used for a metal etching treatment, it is important for the acid not to erode the transparent electrode 2. In general, a chlorine-base acid is used for the patterning treatment of the transparent electrode 2 and a mixture acid of phosphoric acid and nitric acid. Such mixture acid is utilized for the etching treatment of Al and Ag alloys, but has a property not eroding the transparent electrode formed at a high temperature, and hence, has been utilized from old days. After the steps mentioned above, a luminescent layer is laminated, and thereafter, a metal electrode as cathode is formed on the luminescent layer in shape of stripe extending in a direction normal to the transparent electrode 2.

When a direct current (DC) field is applied between the transparent electrode (anode side) and the metal electrode (cathode side), an electric current passes an organic compound and the luminescent layer is hence emitted. The light emitted from the luminescent layer is taken out on the transparent electrode side.

In order to make thin an organic EL display device, a resin substrate may be utilized in place of the glass substrate, and in such case, the substrate can be made thin and, in addition, can hardly be cracked. Furthermore, the organic EL display device utilizing the resin substrate has flexibility so as to be bendable, thus being advantageous.

However, in the structure in which, as like as the glass substrate, the transparent electrode and the metal auxiliary electrode are laminated on the substrate, it is obliged for the transparent electrode to be formed at a low temperature less than 100° C. because of heat resistant property of the resin substrate. The transparent electrode thus formed at the low temperature has a nature, different from that formed at a high temperature of more than 200° C., that is easily eroded by acid. This nature will be also applied to the case of using the mixture acid of phosphoric acid and nitric acid, and the surface of the transparent electrode is corroded and made coarse by such acid at the time of the patterning. On such surface, leak or dark spot is likely generated, which results in inadequate display.

SUMMARY OF THE INVENTION

An object of the present invention is to substantially eliminate defects or drawbacks encountered in the prior art described above and to provide a luminescent display device capable of keeping smoothness of a surface of a transparent electrode and obtaining a good displaying result in a case of laminating a transparent electrode and an auxiliary electrode on a resin substrate and also provide a method of manufacturing such luminescent display device.

To achieve the above object and solve the problem raised in the case of preparing the organic EL element on the resin substrate, the inventors of the subject application developed a technology of preparing the organic EL display element on the resin substrate by providing a new layer structure of resin substrate/auxiliary electrode/transparent electrode which is different from the conventional layer structure of glass substrate/transparent electrode/auxiliary electrode.

The above and other objects can be achieved according to the present invention by providing, in one aspect, a luminescent display device comprising:

a resin substrate having one and another surfaces;

an auxiliary electrode made of metal and disposed on the one surface of the resin substrate;

a transparent electrode disposed on the auxiliary electrode, the auxiliary electrode being conductive to the transparent electrode; and a luminescent layer composed of an organic compound and disposed on the transparent electrode.

According to the above structure, the transparent electrode is formed after the formation and patterning of the metal auxiliary electrode, so that the transparent electrode never be eroded by an etching solution at the time of the patterning to the auxiliary electrode. Therefore, the surface of the transparent electrode can be kept smooth, and moreover, since the metal auxiliary electrode is covered by the transparent electrode, the oxidization of the metal auxiliary electrode can be prevented.

In preferred embodiments of this aspect, a layer of metal oxide is further formed between the resin substrate and the auxiliary electrode.

The metal oxide is formed of a conductive material, which is formed into a film and is then subjected to a patterning treatment or process. The metal oxide is formed of an oxide including at least one of tin (Sn), zinc (Zn) and indium (In).

The metal oxide is formed of an insulating material, which is formed into a film. The metal oxide is formed of an oxide including at least one of aluminum (Al), zirconium (Zr), titanium (Ti), calcium (Ca), magnesium (Mg), chromium (Cr), nickel (Ni) and silicon (Si).

A moisture-proof layer may be further formed between the resin substrate and the metal oxide for preventing any moisture or water content.

According to the above preferred embodiments, the location of the metal oxide layer between the resin substrate and the metal auxiliary electrode can improve the adhesive performance of the auxiliary electrode.

When the metal oxide is formed of a conductive material, there may cause a case where the patterned respective auxiliary electrodes become conductive through the formation of the metal oxide layer below the auxiliary electrode. According to this invention, however, since the metal oxide layer is patterned in the same form as that of the auxiliary electrode, the above defect can be solved. On the other hand, when the metal oxide is formed of an insulating material, the patterned auxiliary electrode does not become conductive even if the metal oxide is disposed below the auxiliary electrode. Thus, the patterning process can be eliminated.

The formation of the moisture-proof layer can shut out the invasion of the moisture or water content to the luminescent layer, thus maintaining the good light emission performance.

The above objects can be also achieved by providing, in another aspect, a method of manufacturing the luminescent display device of the characters mentioned above, comprising the steps of:

preparing a resin substrate having one and another surfaces;

laminating an auxiliary electrode made of metal on the one surface of the resin substrate;

laminating a transparent electrode on the auxiliary electrode, which is conductive to the transparent electrode; and laminating a luminescent layer composed of an organic compound on the transparent electrode.

In this aspect, a metal oxide may be further formed on the one surface of the resin substrate before the lamination of the auxiliary electrode.

The metal oxide is formed of a conductive material, which is formed in form of film, and is then subjected to a patterning treatment. The metal oxide may be formed of an insulating material, which is formed into a film.

The metal oxide and the auxiliary electrode are patterned at the same time by utilizing a photolithography technology or using an acid. The transparent electrode is formed into a film through sputtering, ion-plating or epitaxial growth treatment or process and then patterned by utilizing a photolithography technology or using an acid.

According to this aspect, substantially the same effects or functions as those mentioned above may be achieved.

Furthermore, it is to be noted that the present invention will be made further clear from the following descriptions made with reference to the accompanying drawings.

DESCRIPTION OF THE PREFERRED EMBODIMENT

The present invention will be described hereunder with reference to FIG. 1

Figure 1:
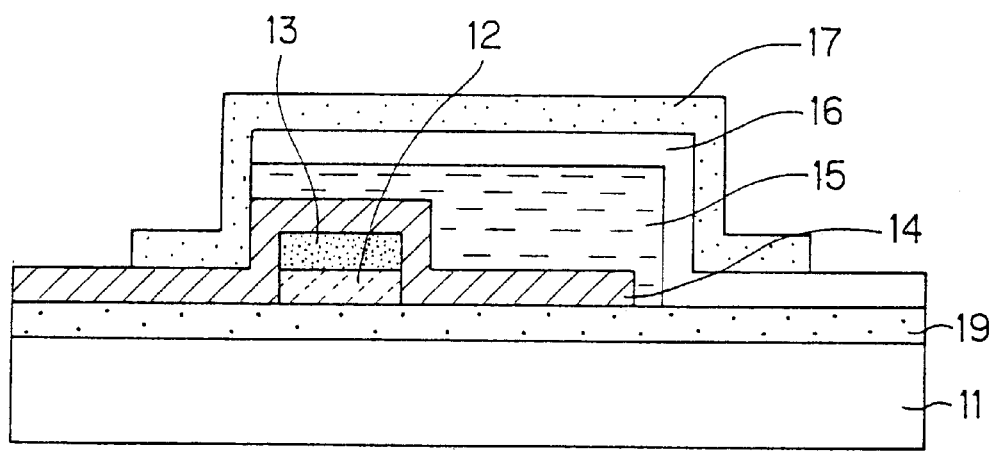
FIG. 1 is an illustrated sectional view of a luminescent display device according to one embodiment of the present invention.

Referring to FIG. 1 showing one embodiment of a luminescent display device of the present invention, the luminescent display device includes a resin substrate 11 on which an organic electro-luminescent (EL) element having a laminated structure is disposed. The laminated structure of the organic EL element comprises a layer composed of a metal oxide 12, an auxiliary electrode 13 of conductive metal material, a transparent electrode 14 and a luminescent layer 15 composed of an organic compound, these materials and electrodes being laminated in the described order on the resin substrate 11.

It is first to be noted that, in the illustrated and described embodiment of the present invention, the subject feature resides in its laminated layer structure of metal oxide 12/metal auxiliary electrode 13/transparent electrode 14 disposed on the resin substrate 11.

In the present embodiment, the resin substrate 11 has a transparent or translucent (semi-transparent) property with respect to a visible light and has, for example, a thickness of 0.2 mm. The resin substrate 11 has at least one surface formed with moisture-proof layer 19 for preventing any moisture or water content. Such resin substrate 11 may preferably be formed from a liquid crystal substrate having a base material of PC (polycarbonate). However, the material and thickness of the resin substrate 11 are not limited to the above ones in the present invention.

The metal oxide layer 12 is formed on the resin substrate 11. This metal oxide layer 12 is formed for the purpose of enhancing or improving adhesion performance between the resin substrate 11 and the metal auxiliary electrode 13.

In the present invention, for the metal oxide 12, an indium-tin oxide is used, and the thin layer of the metal oxide 12 is formed by or through a vacuum evaporation, sputtering, ion-plating or epitaxial growth treatment or process. This thin layer into a film (film shape) is subjected to a patterning treatment so as to provide the same plane shape as that of the auxiliary electrode 13 in the patterning treatment of the auxiliary electrode 13 which is carried out thereafter.

In the case where the metal oxide 12 is formed from a conductive material, there may cause a case that the patterned auxiliary electrodes 13 are made conductive when the metal oxide layers 12 are formed below the layers of the auxiliary electrodes 13, respectively. In order to eliminate such defect of electrical conduction of the auxiliary electrodes 13, the metal oxides 12 are patterned together with the auxiliary electrodes 13.

In this embodiment, although the indium-tin oxide is utilized as the metal oxide 12, another one may be utilized as far as it can ensure good adhesion property between the metal oxide of thin film and the transparent or translucent metal auxiliary electrode 13. Further, in the case where the patterning is required as in the present embodiment, there will be used an oxide, as metal oxide 12, including at least either one of tin (Sn), zinc (Zn) and indium (In). In a case where the metal oxide is formed of an insulating material, it is not necessary to carry out the patterning treatment as in the present embodiment. There will be used, as metal oxide 12 formed of insulating material, an oxide including at last one of aluminum (Al), zirconium (Zr), titanium (Ti), calcium (Ca), magnesium (Mg), chromium (Cr), nickel (Ni), silicon (Si) and the like.

The metal auxiliary electrode 13 is laminated on the metal oxide layer 12 so as to be electrically connected to the transparent electrode 14 for the purpose of realizing a reduced resistance of the transparent electrode 14. The auxiliary electrode 13 is formed by forming a thin metal film through a vacuum evaporation, sputtering, ion-plating or epitaxial growth treatment or process, and thereafter, the thus formed thin metal film is patterned by utilizing a photolithography technology or using acid or like. At the time of the patterning treatment to the metal thin film, the metal oxide 12 disposed below the auxiliary electrode 13 is also subjected to the patterning treatment together with the auxiliary electrode 13. Such auxiliary electrode 13 may be formed from an alloy of silver (Ag), chromium (Cr), molybdenum (Mo), copper (Cu), aluminum (Al) or like.

On the auxiliary electrode 13, is disposed the transparent electrode 14 as anode. The transparent electrode 14 has transparent or translucent property with respect to visual light, and for example, is formed of a conductive material such as an oxide of indium-tin, an oxide of indium-zinc, or like. Such transparent electrode 14 is formed by first forming a thin film of oxide through vacuum evaporation, sputtering, ion-plating or epitaxial growth treatment or process, and thereafter, by patterning the thus formed thin film. The transparent electrode 14 is formed so as to provide a stripe plane shape.

Furthermore, the luminescent layer 15 is further formed on the transparent electrode 14 by evaporating and sputtering an organic compound. The luminescent layer 15 formed of the organic compound may have a single layer structure having only one organic layer or have a multi (plural) layer structure in which a plurality of functions such as luminous function, carrier conveying function or like function are endowed separately to the respective layers.

On the luminescent layer 15, there is further disposed a metal electrode 16 as cathode, which is formed into a film shape and then patterned. The metal electrode 16 is formed as a thin metal film so as to provide a stripe shape normal to the transparent electrode 14.

As mentioned above, the EL element is composed of the metal oxide 12, the auxiliary electrode 13, the transparent electrode 14, the luminescent layer 15 and the metal electrode 16, which are disposed in this order on one surface (upper surface as viewed in FIG. 1) of the resin substrate 11, and are covered by a seal layer 17. The seal layer 17 is formed of a silicon nitride, epoxy resin or like material and disposed for the purpose of preventing the invasion of moisture or water content in the atmospheric air into the luminescent layer 15.

When a direct current (DC) field is applied between the transparent electrode (anode) 14 and the metal electrode (cathode), positive holes are injected from the anode into the luminescent layer 15 and electrons are also injected from the cathode thereinto, whereby light emitted from the organic compound in the luminescent layer 15 is taken out through another surface (lower surface as viewed in FIG. 1) side of the resin substrate 11.

Figure 2:
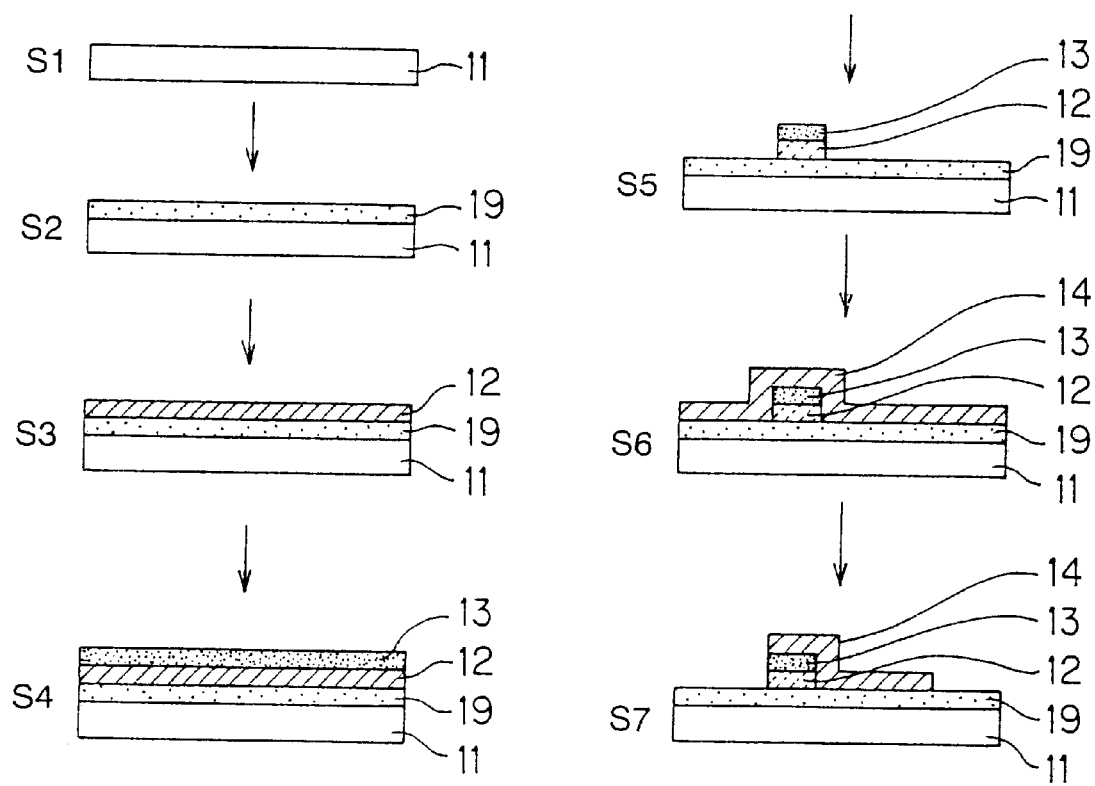
FIG. 2 includes views representing a manufacturing steps of the luminescent display device of FIG. 1.

FIG. 2 includes several views representing the manufacturing steps of the luminescent display device of FIG. 1 of the present invention.

First, the transparent resin substrate 11 is prepared (step S1). In the next step (step S2), a moisture-proof layer 19 is formed in form of film on at least one surface of the resin substrate 11 through the evaporation, sputtering, ion-plating, epitaxial growth treatment or process, or like process. Thereafter, the metal oxide layer 12 is formed, in form of film, on the moisture-proof layer 19 through the sputtering, ion-plating or epitaxial growth treatment or process (step S3). Further, in the next step (step S4), the auxiliary electrode 13 is then formed in form of film on the layer of the metal oxide 12 through the evaporation, sputtering, ion-plating or epitaxial growth treatment or process. Next, the auxiliary electrode 13 and the metal oxide 12 are subjected together to the patterning treatment by utilizing photolithography technology or using an acid (step S5). The transparent electrode 14 is further formed into a film on the same surface side of the resin substrate 11 through, as that mentioned above, the sputtering process, ion-plating process or epitaxial growth process (step S6). This transparent electrode 14 is then patterned by utilizing the photolithography technology or using an acid (step S7).

After the above steps, the luminescent layer 15 is formed into a film by carrying out the evaporation, sputtering, spin-coat, screen printing or fine-grain spraying treatment or process to an organic compound. Thereafter, the metal electrode 16 is formed on the luminescent layer 15 by utilizing the evaporation process, sputtering process or photolithography technology, or using an acid.

As mentioned above, according to the present invention, the transparent electrode 14 is formed into a film after the forming and patterning treatments of the metal auxiliary electrode 13, so that there is no fear of erosion of the transparent electrode 14 by the etching solution at the time of patterning of the auxiliary electrode 13. For this advantage, the surface of the transparent electrode 14 can be kept smooth and fine luminescent condition can be maintained. Moreover, since the metal auxiliary electrode 13 is covered by the transparent electrode 14, the oxidation of the metal auxiliary electrode 13 can be prevented. Furthermore, since the metal oxide layer 12 is interposed between the resin substrate 11 and the auxiliary electrode 13, the adhesion property of the auxiliary electrode 13 to the resin substrate 11 can be improved.

A preferred example of luminescent display device manufactured by the present invention will be compared hereunder with comparative examples.

EXAMPLE 1 OF THE INVENTION

In accordance with the steps S1 and S2 in FIG. 2, the moisture-proof layer 19 was first formed into a film for preventing moisture or water content from the surface of the resin substrate 11. Thereafter, indium-tin oxide was spattered into a film as metal oxide 12 on the moisture-proof layer 19, and silver-palladium copper alloy was sputtered so as to form the metal auxiliary electrode 13 in form of film (steps S3 and S4 in FIG. 2). Then, the metal oxide 12 and the auxiliary electrode 13 were patterned so as to provide substantially the same shape, and thereafter, indium-tin oxide was sputtered so as to provide the transparent electrode 14 into a film (steps S5 and S6 in FIG. 2). The transparent electrode 14 was then patterned so as to form an electrode for the organic EL element (step S7 in FIG. 2).

When the organic EL element was formed on the transparent electrode 14 and was emitted, even emission could be obtained.

COMPARATIVE EXAMPLE 1

Figure 3:
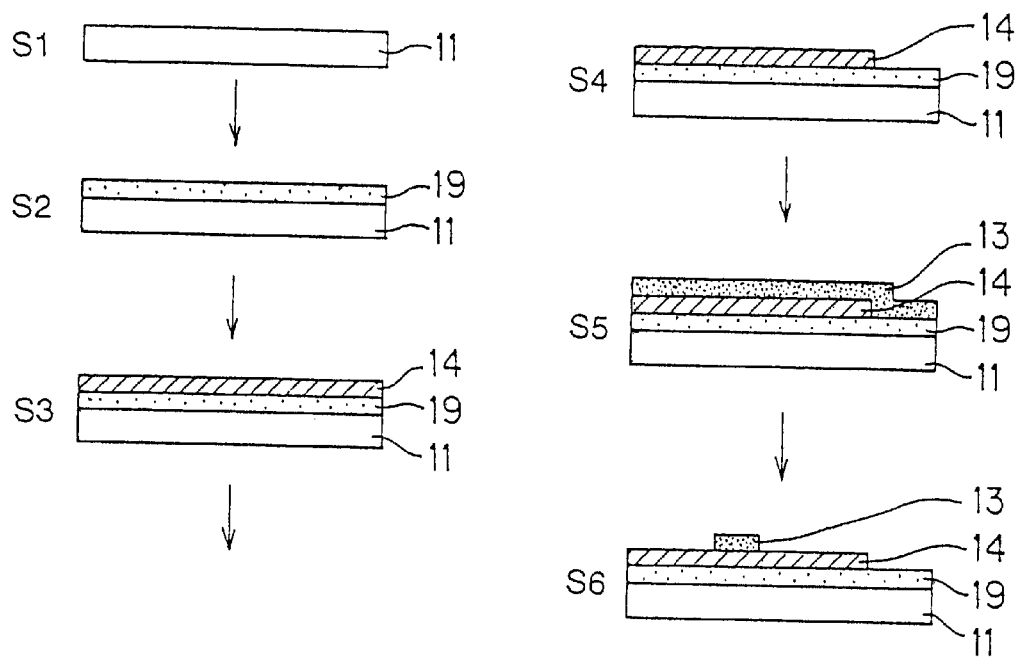
FIG. 3 includes views representing a manufacturing steps of a luminescent display device prepared for a comparison (Comparative Example 1) with the embodiment of the present invention of FIG. 1.

With reference to FIG. 3 representing a series of steps S1 to S6 for manufacturing a comparative example 1. In steps S1 to S2, the resin substrate 11 was prepared and the moisture-proof layer 19, into a film, for preventing the moisture or water content was formed on the surface of the resin substrate 11. Thereafter, indium-tin oxide was sputtered so as to provide the transparent electrode 14 into a film and then patterned (steps S3 and S4 in FIG. 3). Next, silver-palladium copper alloy was sputtered so as to form the metal auxiliary electrode 13, into a film, on the transparent electrode 14, and then patterned as an electrode for an organic EL element (steps S5 and S6 in FIG. 3).

When the organic EL element was formed on the auxiliary electrode 13 and was emitted, a number of dark-spots appeared, being defective. It was found that such defect was based on that, at the time of the patterning of the metal auxiliary electrode 13, the transparent electrode 14 was eroded by an etching solution.

COMPARATIVE EXAMPLE 2

Figure 4:
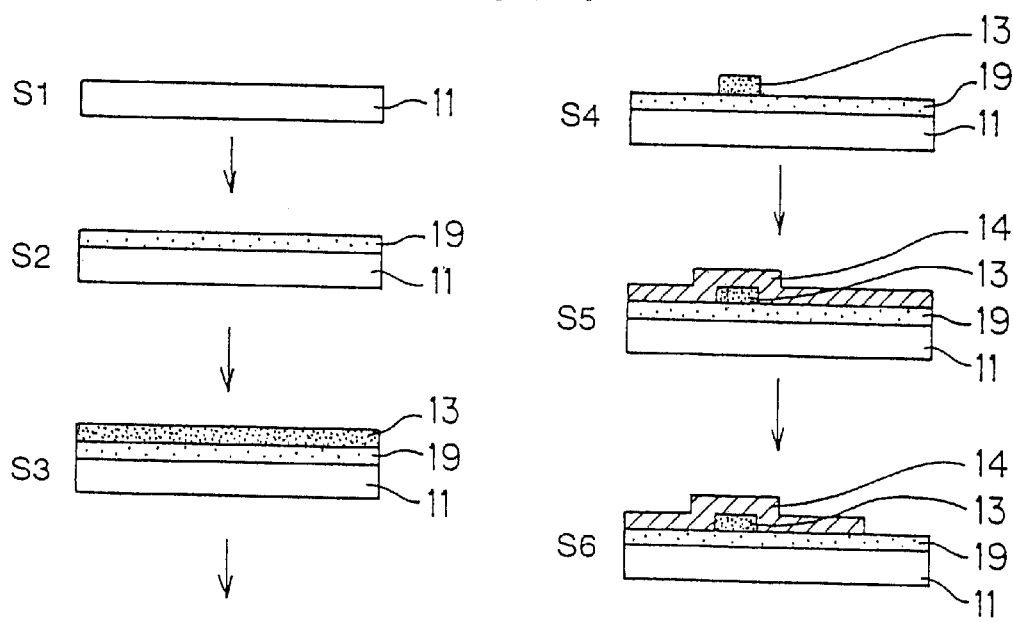
FIG. 4 includes views representing a manufacturing steps of a luminescent display device prepared for another comparison (Comparative Example 2) with the embodiment of the present invention of FIG. 1.
Figure 5:
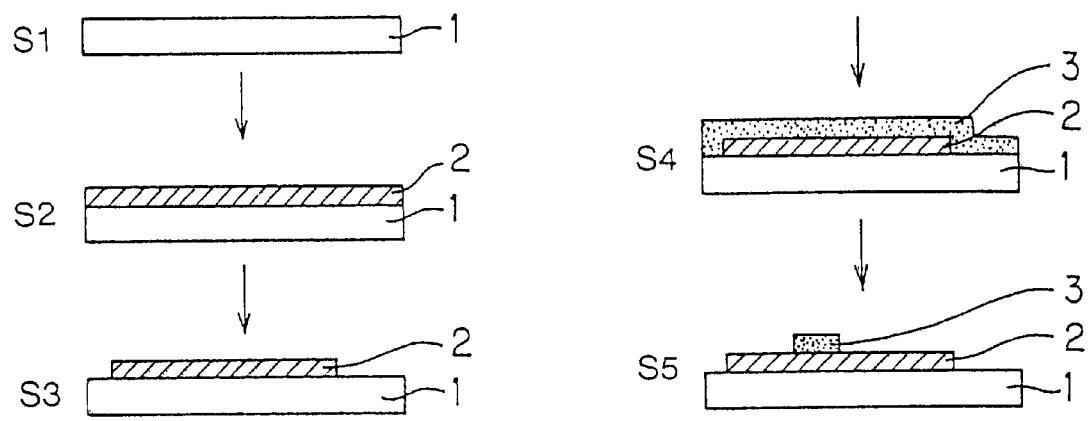
FIG. 5 includes views representing a manufacturing steps of a luminescent display device having a conventional structure.

With reference to FIG. 4 representing a series of steps S1 to S6 for manufacturing a comparative example 2. An organic EL element was formed on the resin substrate 11 in accordance with these steps. In steps S1 to S2, the resin substrate 11 was prepared and the moisture-proof layer 19, in form of film, preventing the moisture or water content was formed on the resin substrate 11. Thereafter, copper-palladium silver alloy was sputtered so as to form the metal auxiliary electrode 13, into a film, and then patterned (steps S3 and S4 in FIG. 4). Next, indium-tin oxide was sputtered so as to provide the transparent electrode 14 into a film and then patterned so as to provide an electrode for an organic EL element (steps S5 and S6 in FIG. 4). During these manufacturing steps, there caused a problem that the metal auxiliary electrode 13 was peeled from the resin substrate 11.

As described above with reference to the preferred example of the present invention and comparative examples, in the present invention, the transparent electrode is formed after the formation and patterning of the metal auxiliary electrode, and accordingly, the transparent electrode is never eroded by the etching solution at the patterning treatment of the auxiliary electrode. Because of this advantageous effect, the surface of the transparent electrode can be kept smooth and the fine illuminating condition can be maintained. Moreover, the metal auxiliary electrode can be prevented from being oxidized. Furthermore, the location of the metal oxide between the metal auxiliary electrode and the resin substrate can effectively improve the adhesion property of the metal film.

Further, it is to be noted that the present invention is not limited to the described embodiment, and many other changes and modifications may be made without departing from the scopes of the appended claims.

The present application claims priority under 35 U.S.C §119 to Japanese Patent Application No.2001-141198, filed on May 11, 2001 entitled "LUMINESCENT DISPLAY DEVICE AND METHOD OF MANUFACTURING SAME". The contents of that application are incorporated herein by reference in their entirety.

What is claimed is:

1. A luminescent display device comprising:
a resin substrate having one and another surfaces;
an auxiliary electrode made of metal and disposed on the one surface of the resin substrate;
a transparent electrode disposed on the auxiliary electrode, said auxiliary electrode being connected to the transparent electrode; and
a luminescent layer composed of an organic compound and disposed on the transparent electrode.

2. A luminescent display device according to claim 1, further comprising a layer of metal oxide formed between the resin substrate and the auxiliary electrode.

3. A luminescent display device according to claim 2, wherein said metal oxide is formed of a conductive material, which is formed into a film and is then subjected to a patterning treatment.

4. A luminescent display device according to claim 3, wherein said metal oxide is formed of an oxide including at least one of tin (Sn), zinc (Zn) and indium (In).

5. A luminescent display device according to claim 2, wherein said metal oxide is formed of an insulating material, which is formed into a film.

6. A luminescent display device according to claim 5, wherein said metal oxide is formed of an oxide including at least one of aluminum (Al), zirconium (Zr), titanium (Ti), calcium (Ca), magnesium (Mg), chromium (Cr), nickel (Ni) and silicon (Si).

7. A luminescent display device according to claim 2, further comprising a moisture-proof layer for preventing moisture between the resin substrate and the metal oxide.

8. A luminescent display device according to claim 3, wherein said auxiliary electrode is patterned in the same form as said metal oxide layer.

9. A luminescent display device according to claim 1, wherein said luminescent layer comprises a plurality of layers.

* * * * *